US008138661B2

(12) United States Patent
Kokubu et al.

(10) Patent No.: US 8,138,661 B2
(45) Date of Patent: Mar. 20, 2012

(54) SIDE SURFACE LIGHT EMITTING DEVICE

(75) Inventors: Hideki Kokubu, Aichi-ken (JP); Toshimasa Hayashi, Aichi-ken (JP); Yuhki Ito, Aichi-ken (JP); Michio Miyawaki, Kagoshima (JP)

(73) Assignees: Toyoda Gosei Co., Ltd., Aichi-ken (JP); Panasonic Corporation, Osaka (JP)

( * ) Notice: Subject to any disclaimer, the term of this patent is extended or adjusted under 35 U.S.C. 154(b) by 488 days.

(21) Appl. No.: 12/318,340

(22) Filed: Dec. 24, 2008

(65) Prior Publication Data
US 2009/0167142 A1 Jul. 2, 2009

(30) Foreign Application Priority Data
Dec. 27, 2007 (JP) .............................. P. 2007-336967

(51) Int. Cl.
*H01J 5/48* (2006.01)
*H01J 5/50* (2006.01)
(52) U.S. Cl. ......... 313/318.11; 313/318.01; 313/318.05; 313/318.12; 313/512; 362/555; 362/612
(58) Field of Classification Search ............... D13/180; D26/2; 313/498–512, 318.11, 318.1, 318.5, 313/318.12; 362/555, 612, 800, 458, 373, 362/310, 296.1, 294, 549, 546–547, 514
See application file for complete search history.

(56) References Cited

U.S. PATENT DOCUMENTS
5,040,868 A    8/1991  Waitl et al.
D527,352 S *  8/2006  Wu et al. ..................... D13/180
D536,672 S *  2/2007  Asakawa ...................... D13/180
7,393,122 B2  7/2008  Tsuzuki et al.
7,566,159 B2* 7/2009  Oon et al. ..................... 362/612
(Continued)

FOREIGN PATENT DOCUMENTS
CN         1526165 A      9/2004
(Continued)

OTHER PUBLICATIONS
Chinese Office Action dated Dec. 16, 2010, with English translation.
(Continued)

*Primary Examiner* — Nimeshkumar Patel
*Assistant Examiner* — Jose M Diaz
(74) *Attorney, Agent, or Firm* — McGinn IP Law Group, PLLC

(57) ABSTRACT

In a side surface light emitting type light emitting device mounted on the surface of a wiring board, the light emitting device comprises: a base body part having a reflecting case and a terminal holding part formed integrally with the reflecting case in the rear part of the reflecting case; and lead members inserted into the base body part, having a pair of connecting parts including base parts of the connecting parts drawn out from the lower surface of the base body part and bent along the lower surface and side bending parts provided in the base parts of the connecting parts and bent along the side surfaces of the terminal holding part and connected to a pattern of the wiring board; and is characterized in that the base parts of the connecting parts are provided with protruding parts protruding toward the center of the lower surface of the terminal holding part and cut-out parts are provided for accommodating the protruding parts in the lower surface of the terminal holding part.

20 Claims, 4 Drawing Sheets

U.S. PATENT DOCUMENTS

| | | | |
|---|---|---|---|
| D597,499 S * | 8/2009 | Kokubu et al. | D13/180 |
| D599,306 S * | 9/2009 | Kong | D13/180 |
| D601,516 S * | 10/2009 | Han et al. | D13/180 |
| D605,610 S * | 12/2009 | Han et al. | D13/180 |
| D606,032 S * | 12/2009 | Lee et al. | D13/180 |
| D608,307 S * | 1/2010 | Hussell et al. | D13/180 |
| 7,701,050 B2 * | 4/2010 | Chen et al. | 257/693 |
| D633,058 S * | 2/2011 | Lin | D13/180 |
| 2003/0062601 A1 | 4/2003 | Harnden et al. | |
| 2004/0046242 A1 * | 3/2004 | Asakawa | 257/678 |
| 2005/0145998 A1 | 7/2005 | Harnden et al. | |
| 2006/0101757 A1 * | 5/2006 | Tsuzuki et al. | 52/405.3 |
| 2006/0220205 A1 * | 10/2006 | Hongo et al. | 257/680 |
| 2007/0001187 A1 * | 1/2007 | Kim | 257/98 |

FOREIGN PATENT DOCUMENTS

| | | |
|---|---|---|
| CN | 1758458 A | 4/2006 |
| CN | 1758458 (A) | 4/2006 |
| CN | 1835221 (A) | 9/2006 |
| JP | 1171708 | 4/2003 |
| JP | 2006-253551 | 9/2006 |
| JP | 2006-253551 A | 9/2006 |
| JP | 2006-261308 A | 9/2006 |
| JP | 1288058 | 12/2006 |
| WO | WO 02/093645 A1 | 11/2002 |

OTHER PUBLICATIONS

Chinese Office Action dated Jun. 4, 2010, with English translation.

Chinese Office Action dated Dec. 7, 2011 (with an English translation).

* cited by examiner

SIDE SURFACE LIGHT EMITTING DEVICE

BACKGROUND OF THE INVENTION

1. Field of the Invention

The present invention relates to a side surface light emitting type light emitting device mounted on the surface of a wiring board.

2. Description of the Related Art

An example of the light emitting device of the above-described type is disclosed in Patent Document 1. In this light emitting device, lead members are drawn out from both side parts of a reflecting case having a front part opened and a planar bottom part, and a terminal holding part is integrally provided in the rear part of the reflecting case. The parts of the lead members that are drawn out from the reflecting case are bent along the side surfaces of the terminal holding part from the side parts of the reflecting case, and further bent along the lower surface of the terminal holding part and ends thereof are accommodated in cut out parts as connecting parts.

On the other hand, Patent Document 2 discloses a side surface light emitting type light emitting device in which lead members are drawn out from the lower surface of a reflecting case of the light emitting device and bent along the lower surface of a terminal holding part. Further, Patent Document 3 discloses a structure that lead members drawn out from the lower part of a light reflecting case of a light emitting device and bent along the lower surface of a terminal holding part are further bent along the side surfaces of the terminal holding part.

Patent Document 1: JP-A-2006-253551

Patent Document 2: Japanese Design Registration No. 1171708

Patent Document 3: Japanese Design Registration No. 1288058

It has been required for a recent light emitting device to have a high output. Therefore, the light emitting device is liable to mount a high output LED chip thereon. The high output LED chip generates a great heat. When the temperature of the LED chip itself becomes high, the output of the LED chip is undesirably low. Thus, heat needs to be effectively radiated from the LED chip. Since a side surface light emitting type light emitting device is used as a light source of a display of a portable telephone, the side surface light emitting type light emitting device needs to be compact. Accordingly, a heat radiating member such as a heat sink is not used to transmit the heat to a wiring board through a lead member on which the LED chip is mounted and radiate the heat. In the light emitting device disclosed in the Patent Document 1, the lead members are drawn out from both the side parts of the reflecting case. However, since the side surface light emitting type light emitting device is long in a transverse direction, a heat radiating path is long so that a heat radiating effect is low. On the other hand, in the light emitting devices disclosed in the Patent Documents 2 and 3, since the lead members are drawn out from the lower surface of the reflecting case, a heat radiating path is short. However, since a drawn out part of the lead member is compact depending on the miniaturization of the light emitting device, a contact area of the lead members and the wiring board is relatively reduced. Thus, an adequate heat radiating effect cannot be obtained.

SUMMARY OF THE INVENTION

Thus, it is an object of the present invention to provide a structure compact and high in its heat radiating effect in a side surface light emitting type light emitting device.

The present invention is devised to achieve the above-described object and the structure thereof is defined as described below.

In a side surface light emitting type light emitting device mounted on the surface of a wiring board, the light emitting device comprises: a base body part having a reflecting case and a terminal holding part formed integrally with the reflecting case in the rear part of the reflecting case; and lead members inserted into the base body part, having a pair of connecting parts including base parts of the connecting parts drawn out from the lower surface of the base body part and bent along the lower surface and side bending parts provided in the base parts of the connecting parts and bent along the side surfaces of the terminal holding part and connected to a pattern of the wiring board; and is characterized in that the base parts of the connecting parts are provided with protruding parts protruding toward the center of the lower surface of the terminal holding part and cut-out parts are provided for accommodating the protruding parts in the lower surface of the terminal holding part.

In the light emitting device constructed as described above, the lead members are provided with the protruding parts protruding toward the center of the lower surface of the terminal holding part. Since the protruding parts are formed integrally with the lead members, the protruding parts are allowed to come into contact with the wiring board to improve a heat radiating effect. That is, the protruding parts play the role of heat radiating plates. Since the protruding parts are accommodated in the cut out parts in the lower surface of the terminal holding part and do not protrude to an external part, the device can be made to be compact. Further, an external force is prevented from being excessively exerted on the lead members to reduce the bending or breakage of the lead members. Further, since the protruding parts form a part of the connecting parts for connecting the lead members to the wiring board, the connecting area of the connecting parts of the lead members and the wiring board is increased. Thus, even when a position on which the light emitting device is mounted is slightly shifted, it is permissible. Accordingly, the light emitting device is easily mounted. As a result, workability in attaching is improved and a yield is improved.

According to a second aspect of the present invention, the present invention is defined as described below. That is, in the light emitting device according to the first aspect, the lower surfaces of the base parts of the connecting parts and the lower surfaces of the protruding parts are flush with the lower surface of the reflecting case.

According to the invention of the second aspect defined as described above, the connecting parts do not protrude from the lower part of the device. Thus, a light emitting area of the light emitting device is ensured and the thickness of the entire part of the device can be reduced at the same time.

According to a third aspect of the present invention, the present invention is defined as described below. That is, in the light emitting device according to the first or second aspect, the protruding parts are provided in the ends of the base parts of the connecting parts.

According to the invention of the third aspect defined as described above, the protruding parts are provided at positions sufficiently separated from the bending parts (namely, bottom parts drawn out from the reflecting case) of the base parts of the connecting parts.

Since the side surface light emitting type light emitting device is frequently exclusively used for a light source for lighting a portable telephone, an entire size is regulated. As a result, the base body part ordinarily formed with a resin is apt to be made of a thin member. When a force required for bending the base part of the connecting part drawn out in such a base body part is increased, there is a fear that an excessive force is exerted on the base body part to deteriorate a mechanical strength. Thus, when the protruding part is provided at a position sufficiently separated from the bending part of the base part of the connecting part, since the width of the bending part is not enlarged due to the protruding part, the force required for bending the base part of the connecting part is not increased. Thus, the mechanical strength of the base body part is prevented from being deteriorated.

BRIEF DESCRIPTION OF THE DRAWINGS

FIG. 1(A) is perspective view showing a light emitting device 1 from a front surface. FIG. 1(B) is a perspective view showing the light emitting device from a bottom surface.

FIG. 2(A) is a plan view. FIG. 2(B) is a left side view. FIG. 2(C) is a front view. FIG. 2(D) is a right side view. FIG. 2(E) is a bottom view. FIG. 2(F) is a rear view.

DESCRIPTION OF THE PREFERRED EMBODIMENTS

Now, an embodiment of the present invention will be described below by referring to an illustrated example.

Figure 1:
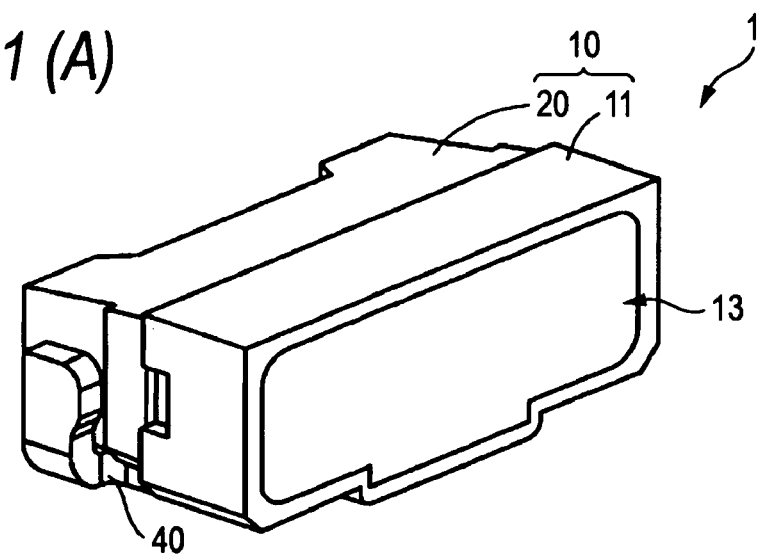
FIG. 1 is a perspective view of a light emitting device of an embodiment of the present invention.
Figure 1:
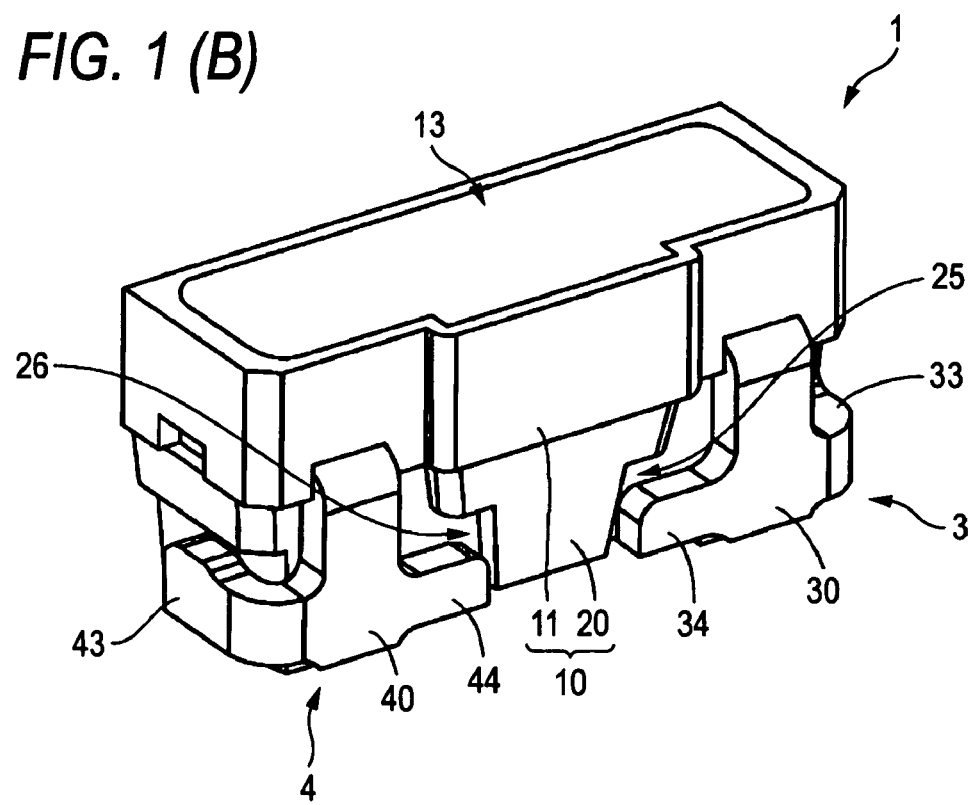
Figure 2:
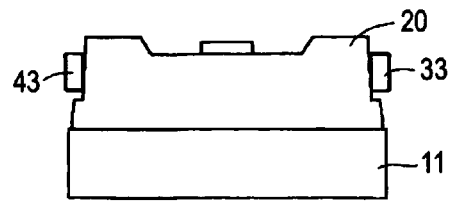
FIG. 2 is a hexahedral view.
Figure 2:
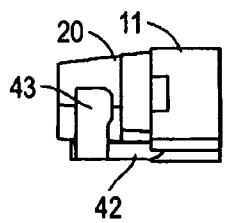
Figure 2:
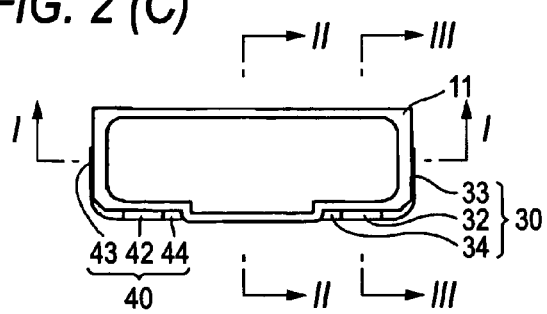
Figure 2:
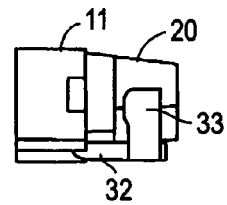
Figure 2:
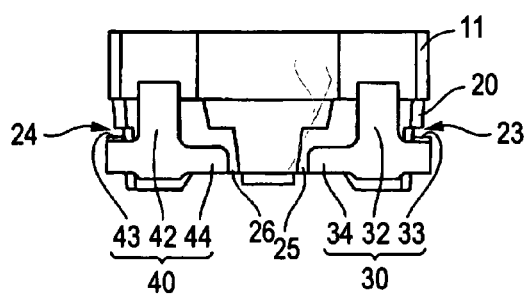
Figure 2:
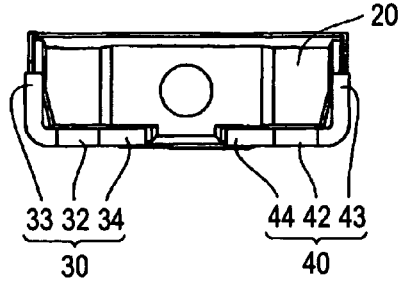
Figure 3:
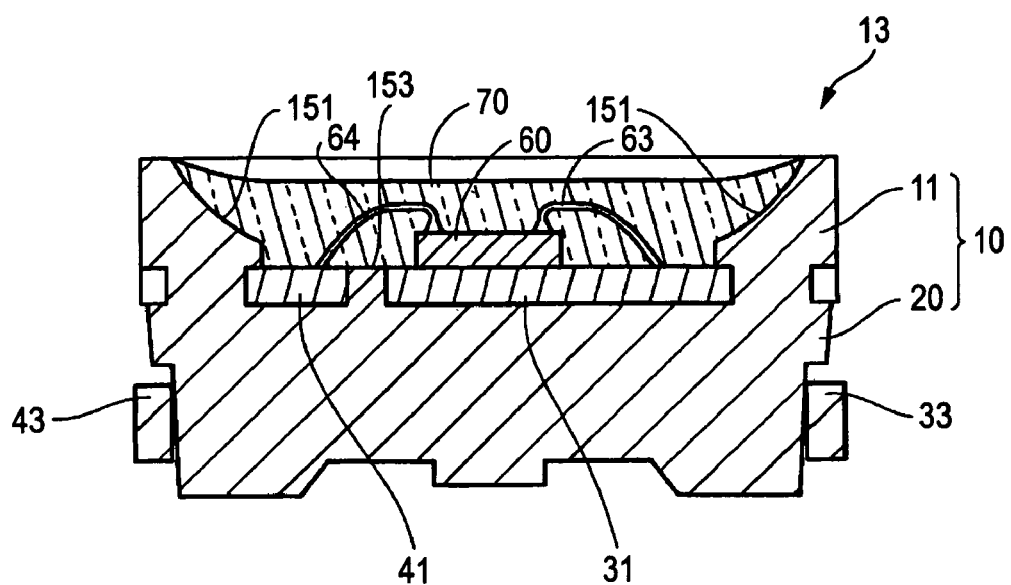
FIG. 3 is a sectional view taken along a line I-I in FIG. 2(C).
Figure 4:
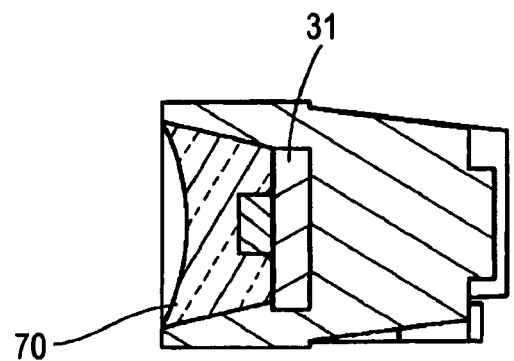
FIG. 4 is a sectional view taken along a line II-II in FIG. 2(C).
Figure 5:
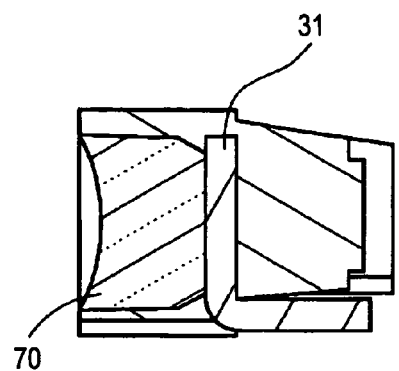
FIG. 5 is a sectional view taken along a line III-III in FIG. 2(C).

FIG. 1(A) is perspective view showing a light emitting device 1 of the embodiment from a front surface. FIG. 1(B) is a perspective view showing the light emitting device from a bottom surface. FIG. 2 is a hexahedral view. FIG. 2(A) is a plan view. FIG. 2(B) is a left side view. FIG. 2(C) is a front view. FIG. 2(D) is a right side view. FIG. 2(E) is a bottom view FIG. 2(F) is a rear view. FIG. 3 is a sectional view taken along a line I-I in FIG. 2(C). FIG. 4 is a sectional view taken along a line II-II in FIG. 2(C). FIG. 5 is a sectional view taken along a line III-III in FIG. 2(C).

As shown in FIG. 1(B), the light emitting device 1 of the embodiment includes a base body part 10, a first lead member 3 and a second lead member 4.

The base body part 10 includes a reflecting case 11 and a terminal holding part 20. As shown in FIG. 3, the reflecting case 11 has a transversely long cup shape and an inner peripheral surface of a recessed part 13 serves as a reflecting surface. The recessed part 13 is filled with a silicone resin type sealing member to form a sealing part 70.

The inner peripheral surface of the recessed part 13 includes a side wall part 151 and a bottom part 153. In the bottom part 153, insert parts 31 and 41 of the lead members 3 and 4 are exposed. A material with which the reflecting case 11 is formed is a resin material. The insert parts 31 and 41 are coated with the resin material to increase a contact area of the resin to resin to the sealing member made of the silicone resin so that an adhesion by the sealing member can be improved. Here, the contact area of the resin to resin is the contact area between the resin of the reflecting case and the (silicone) resin of the sealing member. Further, the inner peripheral surface of the recessed part 13 can be coated with a white paint.

As shown in FIG. 2(E), the terminal holding part 20 is formed integrally with the reflecting case 11 in the rear part of the reflecting case 11 and entirely solid. In the side surfaces of the terminal holding part 20, two cut out parts 23 and 24 are formed. In the lower surface (a bottom surface side) of the terminal holding part 20, cut out parts 25 and 26 are formed that are directed toward a central part from both the side parts of the terminal holding part 20.

The first lead member 3 includes the insert part 31 and a connecting part 30. As shown in FIG. 3, the insert part 31 has a length of about ¾ as long as the length of the base body part 10 in the transverse direction of the base body part 10. In the insert part 31, an LED chip 60 is mounted on a part located at a substantially central part of the reflecting case 11 by a well-known method. In the first lead member 3, a part drawn outside from the base body part 10 is the connecting part 30. As shown in FIG. 2(E), the connecting part 30 includes a base part 32 of a connecting part, a side surface bending part 33 provided at an end of the base part 32 of the connecting part and a protruding part 34. Under a state before the side surface bending part 33 and the protruding part 34 are bent, the side surface bending part 33 and the protruding part 34 are formed in a linear shape. That is, the connecting part 30 has a T shape. Initially, the base part 32 of the connecting part is bent to a lower side (a rear surface side) along the lower surface of the terminal holding part 20 and the protruding part 34 at the end of the connecting part 30 is accommodated in the cut out part 25 of the terminal holding part 20. Then, the side surface bending part 33 is bent along the side surface of the terminal holding part 20 and accommodated in the first cut out part 23. When the light emitting device 1 is observed from an upper surface, as shown in FIG. 2(A), an upper end part of the side surface bending part 33 is located at a side part of the terminal holding part 20. When the light emitting device 1 is observed from a front surface, as shown in FIG. 2(C), the side surface bending part 33 slightly protrudes outside along a right side surface of the reflecting case 11. When the light emitting device 1 is observed from a right side surface side, as shown in FIG. 2(D), the side surface bending part 33 is exposed in the right side surface of the light emitting device 1. In FIG. 2(D), the height of the side surface bending part 33 is a little higher than ½ as high as the height (thickness) of the light emitting device 1. When the light emitting device 1 is observed from a rear surface side, as shown in FIG. 2(F), the connecting part 30 has an L shape and forms a part of an outer edge of the light emitting device 1. On the other hand, the protruding part 34 protrudes toward a central side of a lower surface of the terminal holding part 20 as shown in FIG. 2(E).

The second lead member 4 includes the insert part 41 and a connecting part 40. As shown in FIG. 3, the insert part 41 has a length of about ¼ as long as the length of the base body part 10 in the transverse direction of the base body part 10. In the second lead member 4, a part drawn outside from the base body part 10 is the connecting part 40. As shown in FIG. 2(E), the connecting part 40 includes, similarly to the connecting part 30 of the first lead member 3, a base part 42 of a connecting part, a side surface bending part 43 provided at an end of the base part 42 of the connecting part and a protruding part 44. Initially, the base part 42 of the connecting part is bent to a lower side (a rear surface side) along the lower surface of the terminal holding part 20 and the protruding part 44 is accommodated in the cut out part 26 of the terminal holding part 20. Then, the side surface bending part 43 is bent along the side surface of the terminal holding part 20 and accommodated in the second cut out part 24. When the light emitting device 1 is observed from an upper surface, as shown in FIG. 2(A), an upper end part of the side surface bending part 43 is located at a side part of the terminal holding part 20. When the light emitting device 1 is observed from a front surface, as shown in FIG. 2(C), the side surface bending part 43 slightly protrudes outside along a left side surface of the reflecting case 11. When the light emitting device 1 is observed from a left surface side, as shown in FIG. 2(B), the side surface bending part 43 is exposed in the left side surface of the light emitting device 1. In FIG. 2(B), the height of the side surface bending part 43 is a little higher than ½ as high as the height (thickness) of the light emitting device 1 like the side surface bending part 33. When the light emitting device 1 is observed from a rear surface side, as shown in FIG. 2(F), the connecting part 40 has an L shape and forms a part of an outer edge of the light emitting device 1. On the other hand, the protruding part 44 protrudes toward a central side of a lower surface of the terminal holding part 20 as shown in FIG. 2(E).

In the above-description, the base body part 10 may be formed by using a resin material such as nylon or an inorganic material such as ceramics. The base body part 10 may be formed with a white material and a material itself may have a reflection performance.

As the lead members 3 and 4, a copper plate or Al may be used. In this embodiment, to obtain a good reflection by the lead members 3 and 4, a surface is plated with Ag.

As the LED chip 60, a semiconductor light emitting element of a nitride compound of a III group that emits the light of short wavelength is employed. A suitable phosphor is combined with the LED chip 60 to obtain a white light emission. In this embodiment, as the LED chip, a blue color light emitting diode and a phosphor that absorbs a blue color light and emits a yellow light are selected. The color of the emitted light of the LED chip can be arbitrarily selected. Further, a plurality of LED chips can be mounted on the lead member.

The light emitting device 1 of the embodiment is produced as described below.

The copper plate is pressed and stamped to obtain the lead members 3 and 4 under a state that the connecting parts 30 and 40 are expanded. Then, the lead members 3 and 4 are inserted to the base body part 10 to injection mold the base body part 1. Then, the LED chip 60 is mounted on the first lead member 3 to bond wires 63 and 64. The LED chip 60 and the wires 63 and 64 are sealed by a light transmitting silicone resin from the viewpoint of durability. The phosphors may be dispersed in the silicone resin. After that, the copper plate is cut and divided to obtain a state shown in FIG. 6.

Figure 6:
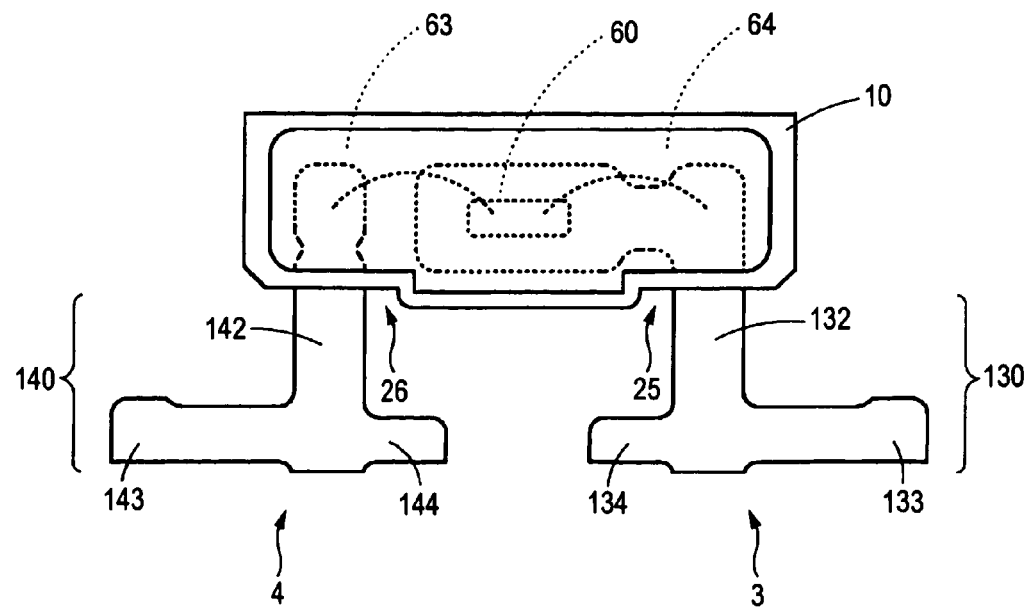
FIG. 6 is a diagram showing a production process of the light emitting device of the embodiment.

As shown in FIG. 6, in the first lead member 3, a drawn out part 130 is drawn out downward in the lower surface of the base body part 10 in the right side of a sheet surface. The drawn out part 130 has a T shape and includes a base part 132 of a drawn out part and ends 133 and 134. Initially, the base part 132 of the drawn out part is bent along the lower surface of the terminal holding part 20 to have the base part 32 of the connecting part. At the same time, the end 134 is accommodated in the cut out part 25 directed toward the central part of the lower surface of the terminal holding part 20 to have the protruding part 34. Here, the depth of the cut out part 25 is slightly larger than the thickness of the protruding part 34. The lower surface of the protruding part 34 is flush with the lower surface of the reflecting case 11 as shown in FIG. 2(C). Then, the end 133 is bent along the side surface of the terminal holding part 20 to have the side bending part 33. The side bending part 33 is exposed on the right side surface of the light emitting device 1 as shown in FIG. 2(D). In the second lead member 4, a T shaped drawn out part 140 including a base part 142 of a drawn out part and ends 143 and 144 is drawn out similarly to the first lead member 3 and sequentially bent to form the base part 42 of the connecting part, the side bending part 43 and the protruding part 44. The side bending part 43 is exposed in the left side surface of the light emitting device 1 as shown in FIG. 2(B). Further, the lower surface of the protruding part 44 is flush with the lower surface of the reflecting case 11 like the protruding part 34 (see FIG. 2(C)).

In the emitting device 1 produced in such a way, under a state that the emitting device 1 is mounted on the wiring board (not shown in the drawing), since the protruding parts 34 and 44 come into contact with the wiring board, a heat radiating effect is increased. That is, the protruding parts 34 and 44 function as heat radiating plates. Since the protruding parts 34 and 44 are accommodated in the cut out parts 25 and 26 in the lower surface of the terminal holding part 20 and do not protrude outside, the protruding parts 34 and 44 contribute to the miniaturization of the light emitting device 1. Further, an external force is prevented from being excessively exerted on the lead members 3 and 4 to reduce the bending or breakage of the lead members 3 and 4. Further, since the protruding parts 34 and 44 form a part of the connecting parts 30 and 40, the protruding parts 34 and 44 are provided to increase the connecting area of the connecting parts 30 and 40 of the lead members and the wiring board. Thus, a tolerance in shift of a mounting position of the light emitting device 1 is increased. Accordingly, the light emitting device 1 is easily mounted. As a result, workability in attaching is improved and a yield is improved.

As shown in FIG. 2 (C), the lower surfaces of the bases 32 and 42 of the connecting parts and the lower surfaces of the protruding parts 34 and 44 are flush with the lower surface of the reflecting case 11. Thus, since the connecting parts 30 and 40 do not protrude from the lower part of the light emitting device 1, a light emitting area (an opening area of the recessed part 13) of the light emitting device 1 is adequately ensured and the thickness of the entire part of the device can be reduced at the same time.

Since the protruding parts 34 and 44 are provided in the ends of the base parts 32 and 42 of the connecting parts, the protruding parts 34 and 44 are provided at positions sufficiently separated from the bending parts (namely, the bottom parts drawn out from the reflecting case 11) of the base parts 32 and 42 of the connecting parts. Since the width of the bending parts is not enlarged due to the protruding parts 34 and 44, the force required for bending the base parts 32 and 42 of the connecting parts is not increased. Thus, the mechanical strength of the base body part 10 is prevented from being deteriorated.

As shown in FIG. 6, under a state before the lead members 3 and 4 are bent, the drawn parts 130 and 140 are T-shaped and the end 133 (143) and the end 134 (144) are formed in a linear shape. Thus, a stability is increased when the end 133 (143) is bent to form the side bending part 33 or 43 and the side bending parts 44 and 43 can be highly accurately formed.

The present invention is not limited to the above-described embodiment of the invention and the explanation of the embodiment. Various modified embodiments may be included in the present invention within a range that can be easily thought by a person with ordinary skill in the art without departing the description of claims.

What is claimed is:

1. A side surface light emitting type light emitting device mounted on a surface of a wiring board, said light emitting device comprising:
   a base body part comprising a reflecting case and a terminal holding part formed integrally with the reflecting case in a rear part of the reflecting case; and
   a lead member inserted into the base body part, said lead member comprising a connecting part including a base part of the connecting part drawn out from a lower surface of the base body part and bent along the lower surface, and a side bending part provided in the base part of the connecting part and bent along a side surface of the terminal holding part and connected to a pattern of the wiring board, wherein the base part of the connecting part is provided with a protruding part protruding toward a center of a lower surface of the terminal holding part, and wherein a cut-out part is provided for accommodating the protruding part in the lower surface of the terminal holding part, a hollow area of the cut-out part spacing apart a side surface of the protruding part from a side surface of the terminal holding part.

2. The light emitting device according to claim 1, wherein the lower surface of the base part of the connecting part and a lower surface of the protruding part are flush with a lower surface of the reflecting case.

3. The light emitting device according to claim 1, wherein the protruding part is provided in ends of the base part of the connecting part.

4. The light emitting device according to claim 1, wherein the side bending part protrudes outside along a side surface of the reflecting case, the base body part comprising a resin.

5. The light emitting device according to claim 1, wherein the lead member extends into an intersection surface of the base body part with the reflecting case for mounting a chip on said intersection surface, said lead comprising a one-piece plate.

6. The light emitting device according to claim 1, wherein the reflecting case comprises a recess filled with a sealing member.

7. The light emitting device according to claim 6, wherein the sealing member coats a part of the lead member that extends inside the reflecting case.

8. The light emitting device according to claim 6, wherein the sealing member abuts a part of the lead member that extends inside the reflecting case.

9. The light emitting device according to claim 6, wherein phosphors are dispersed in the sealing member.

10. The light emitting device according to claim 6, wherein the protruding part contacts with the wiring board.

11. The light emitting device according to claim 1, wherein a lower surface of the protruding part is flush with a lower surface of the reflecting case.

12. The light emitting device according to claim 1, wherein, in a plan view, an upper surface of the protruding part protrudes out from a lower surface of the reflecting case.

13. The light emitting device according to claim 2, wherein, in a plan view, an upper surface of the protruding part protrudes out from the lower surface of the base part of the connecting part and the lower surface of the protruding part.

14. A light emitting device, comprising:
  a base body part comprising a reflecting case and a terminal holding part in a rear part of the reflecting case;
  a lead member inserted into the base body part, said lead member comprising a connecting part that comprises:
    a base part that is drawn out from a lower surface of the base body part and is bent along the lower surface of the base body part;
    a side bending part, placed adjacent to the base part, and bent along a side surface of the terminal holding part; and
    a protruding part, placed adjacent to the base part, and protruding toward a center of a lower surface of the terminal holding part; and
  a cut-out part provided for accommodating the protruding part in the lower surface of the terminal holding part, a hollow area of the cut-out part spacing apart a side surface of the protruding part from a side surface of the terminal holding part.

15. The light emitting device according to claim 14, wherein the lower surface of the base part of the connecting part and a lower surface of the protruding part are flush with a lower surface of the reflecting case, the base body part comprising a resin.

16. The light emitting device according to claim 15, wherein, in a plan view, an upper surface of the protruding part protrudes out from the lower surface of the reflecting case.

17. The light emitting device according to claim 14, wherein the side bending part protrudes outside along a side surface of the reflecting case.

18. The light emitting device according to claim 14, wherein the lead member extends into an intersection surface of the base body part with the reflecting case for mounting a chip on said intersection surface, said lead comprising a one-piece plate.

19. The light emitting device according to claim 14, wherein the reflecting case comprises a recess filled with a sealing member.

20. The light emitting device according to claim 14, wherein a lower surface of the protruding part is flush with a lower surface of the reflecting case.

* * * * *